(12) United States Patent
Linssen et al.

(10) Patent No.: US 11,249,403 B2
(45) Date of Patent: Feb. 15, 2022

(54) VIBRATION ISOLATION SYSTEM AND LITHOGRAPHIC APPARATUS

(71) Applicant: ASML NETHERLANDS B.V., Veldhoven (NL)

(72) Inventors: Franciscus Maria Joannes Linssen, Riel (NL); Hubertus Renier Maria Van Lierop, Weert (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/636,357

(22) PCT Filed: Jul. 2, 2018

(86) PCT No.: PCT/EP2018/067757
§ 371 (c)(1),
(2) Date: Feb. 4, 2020

(87) PCT Pub. No.: WO2019/029908
PCT Pub. Date: Feb. 14, 2019

(65) Prior Publication Data
US 2021/0181639 A1   Jun. 17, 2021

(30) Foreign Application Priority Data
Aug. 8, 2017  (EP) .................................... 17185209

(51) Int. Cl.
*G03F 7/20* (2006.01)
*F16F 15/027* (2006.01)

(52) U.S. Cl.
CPC .......... *G03F 7/709* (2013.01); *G03F 7/70758* (2013.01); *G03F 7/70816* (2013.01); *G03F 7/70841* (2013.01); *F16F 15/027* (2013.01)

(58) Field of Classification Search
CPC .. G03F 7/709; G03F 7/70758; G03F 7/70816; G03F 7/70841; F16F 15/027;
(Continued)

(56) References Cited

U.S. PATENT DOCUMENTS 6,472,840 B1 * 10/2002 Takahashi ............. F16F 7/1005
  318/611
6,953,109 B2 * 10/2005 Watson ..................... F16F 9/02
  188/378

(Continued)

FOREIGN PATENT DOCUMENTS

CN       1848654      10/2006
CN       101510052     8/2009

(Continued)

OTHER PUBLICATIONS

International Search Report and Written Opinion issued in corresponding PCT Patent Application No. PCT/EP2018/067757, dated Oct. 4, 2018.

(Continued)

*Primary Examiner* — Mesfin T Asfaw
(74) *Attorney, Agent, or Firm* — Pilsbury Winthrop Shaw Pittman LLP

(57) ABSTRACT

A vibration isolation system including a support, a forward actuator and a return device. The support is for supporting the body on a base. The support has a body engaging surface and a base engaging surface. The base engaging surface is arranged to couple to the base. The support couples the body engaging surface to the body in a coupled state. The support uncouples the body engaging surface from the body in an uncoupled state. The forward actuator moves the body and the body engaging surface together relatively to the base in a first direction from a first initial position to an end position in the coupled state. The return device is configured to move the body engaging surface relatively to the body opposite to (Continued)

the first direction from the end position to a second initial position in the uncoupled state.

20 Claims, 11 Drawing Sheets

(58) Field of Classification Search
 CPC ....... E02F 3/369; E02F 3/3622; E02F 3/3618; B64G 1/641; E05B 81/25; E05B 47/0642; F16D 41/14; F16D 41/125; A61B 17/07207; A63H 33/108; A61G 13/12; H01R 13/622; F16C 29/025; F16C 32/0603; F16C 2300/62; F16C 33/748
 See application file for complete search history.

(56) References Cited

U.S. PATENT DOCUMENTS

| | | | |
|---|---|---|---|
| 2002/0021425 | A1 | 2/2002 | Janssen et al. |
| 2005/0140961 | A1 | 6/2005 | Yanagisawa et al. |
| 2009/0201477 | A1 | 8/2009 | Butler |
| 2009/0225388 | A1 | 9/2009 | Zaifrani et al. |
| 2011/0216293 | A1 | 9/2011 | Padiy et al. |
| 2014/0021324 | A1 | 1/2014 | Schumacher et al. |

FOREIGN PATENT DOCUMENTS

| | | |
|---|---|---|
| CN | 102754035 | 10/2012 |
| CN | 104678711 | 6/2015 |
| EP | 1148389 | 10/2001 |
| WO | 201613901 | 9/2016 |

OTHER PUBLICATIONS

Chinese Office Action issued in corresponding Chinese Patent Application No. 201880051616.8, dated Jul. 16, 2021.

* cited by examiner

VIBRATION ISOLATION SYSTEM AND LITHOGRAPHIC APPARATUS

CROSS-REFERENCE TO RELATED APPLICATIONS

This application is the U.S. national phase entry of PCT Patent Application No. PCT/EF2018/067757, filed on Jul. 2, 2018, which claims the benefit of priority of European Patent Application No. 17185209.8 filed on Aug. 8, 2017, and which is incorporated herein by its entirety by reference.

BACKGROUND

Field of the Invention

The present invention relates to a vibration isolation system and a lithographic apparatus comprising the vibration isolation system.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In a lithographic apparatus, some parts have to be positioned very accurately in order to obtain the desired quality of the pattern on the substrate, e.g. in terms of focus and position. Such parts are for example optical elements of a projection system which projects the pattered radiation beam onto the substrate, and elements of sensors which monitor for example the position of a substrate support or an optical element of the projection system.

Position sensitive elements such as optical elements and sensor elements are generally located deep inside the lithographic apparatus. Typically, such position sensitive elements are supported by a vibration isolation system to prevent that vibrations from the surrounding deteriorate the position accuracy of the position sensitive element. The position sensitive elements are typically provided with position adjusters which allow to make small adjustments to the positions of the position sensitive elements, e.g. in order to compensate for thermal expansion. However, the range over which the position can be adjusted is relatively small. In case larger adjustments to the position have to be made, for example during an initialization of the lithographic apparatus, the lithographic machine has to be opened and sometimes even partly disassembled in order to adjust the position of a particular element. This is in particular cumbersome and time consuming when the relevant element is located in a vacuum chamber.

SUMMARY

It is desirable to provide a vibration isolation system for supporting a body for which the range is increased over which the body can be moved relatively to a base.

According to an embodiment of the invention, there is provided a vibration isolation system, arranged for supporting a body onto a base, the vibration isolation system comprising:
 a support for supporting the body onto the base, wherein the support has a body engaging surface and a base engaging surface,
 wherein the base engaging surface is arranged to couple to the base,
 wherein the support is arranged to couple the body engaging surface to the body in a coupled state,
 wherein the support is arranged to uncouple the body engaging surface from the body in an uncoupled state;
 a forward actuator configured to move the body and the body engaging surface together relatively to the base in a first direction from a first initial position to an end position in the coupled state,
 a return device configured to move the body engaging surface relatively to the body opposite to the first direction from the end position to a second initial position in the uncoupled state.

In another embodiment of the invention, there is provided a lithographic apparatus comprising a vibration isolation system according to the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
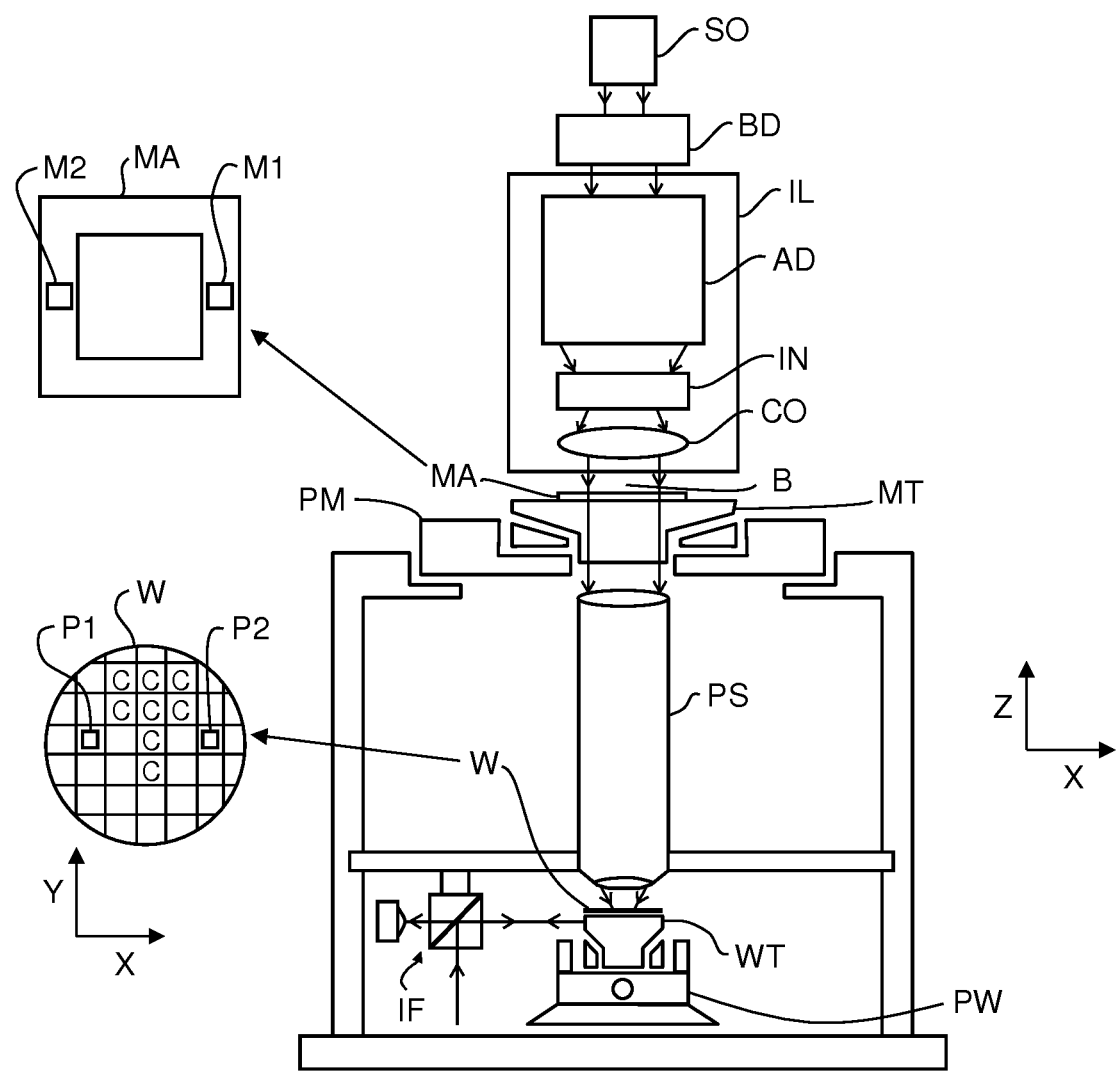
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The mask support structure MT supports, i.e. bears the weight of, the patterning device MA. It holds the patterning device MA in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure MT may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure. In addition to the at least one substrate table WT, the lithographic apparatus may comprise a measurement table, which is arranged to perform measurements but is not arranged to hold a substrate W. The measurement table may be arranged to hold sensor to measure a property of the projection system PS, such as an intensity of the radiation beam B, an aberration of the projection system PS or a uniformity of the radiation beam B. The measurement table may be arranged to hold a cleaning device to clean at least a part of the lithographic apparatus, for example a part near a last lens element of the projection system PS.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device MA and the projection system PS Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The radiation source SO and the lithographic apparatus may be separate entities, for example when the source is an excimer laser. In such cases, the radiation source SO is not considered to form part of the lithographic apparatus and the radiation beam is passed from the radiation source SO to the illuminator IL with the aid of a beam delivery system BD including, for example, suitable directing mirrors and/or a beam expander. In other cases the radiation source SO may be an integral part of the lithographic apparatus, for example when the radiation source SO is a mercury lamp. The radiation source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator IL may be used to condition the radiation beam, to have a desired uniformity and intensity distribution in its cross section.

The radiation beam B is incident on the patterning device MA, which is held on the mask support structure MT, and is patterned by the patterning device. Having traversed the patterning device MA, the radiation beam B passes through the projection system PS, which focuses the radiation beam B onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device MA with respect to the path of the radiation beam B, e.g. after mechanical retrieval from a mask library, or during a scan. In general, movement of the mask support structure MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioner PW. In the case of a stepper (as opposed to a scanner) the mask support structure MT may be connected to a short-stroke actuator only, or may be fixed. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C. Such dedicated target portions are known as scribe-lane alignment marks). Similarly, in situations in which more than one die is provided on the patterning device MA, the mask alignment marks M1, M2 may be located between the dies.

The depicted apparatus could be used in at least one of the following modes:
1. In step mode, the mask support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask support structure MT and the substrate table WT or "substrate support" are scanned synchronously while a pattern imparted to the radiation beam is projected onto a target portion C (i.e. a single dynamic exposure). The velocity and direction of the substrate table WT relative to the mask support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion C.
3. In another mode, the mask support structure MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 2:
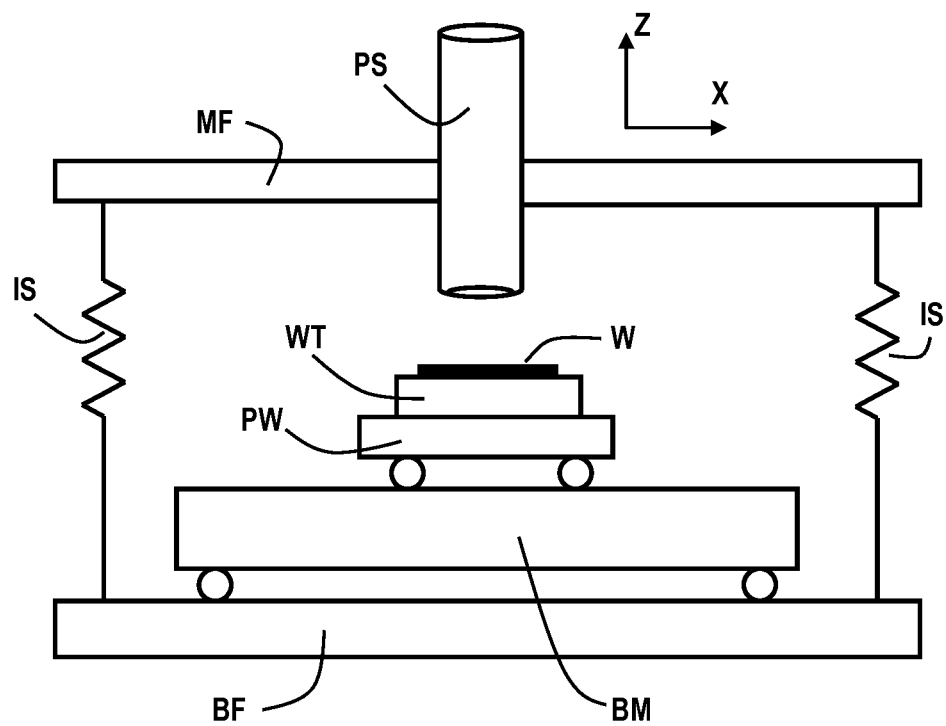
FIG. 2 schematically shows part of the lithographic apparatus according to an embodiment of the invention.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position sensor IF. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF Combinations and/or variations on the above described modes of use or entirely different modes of use may also be employed.

Figure 3:
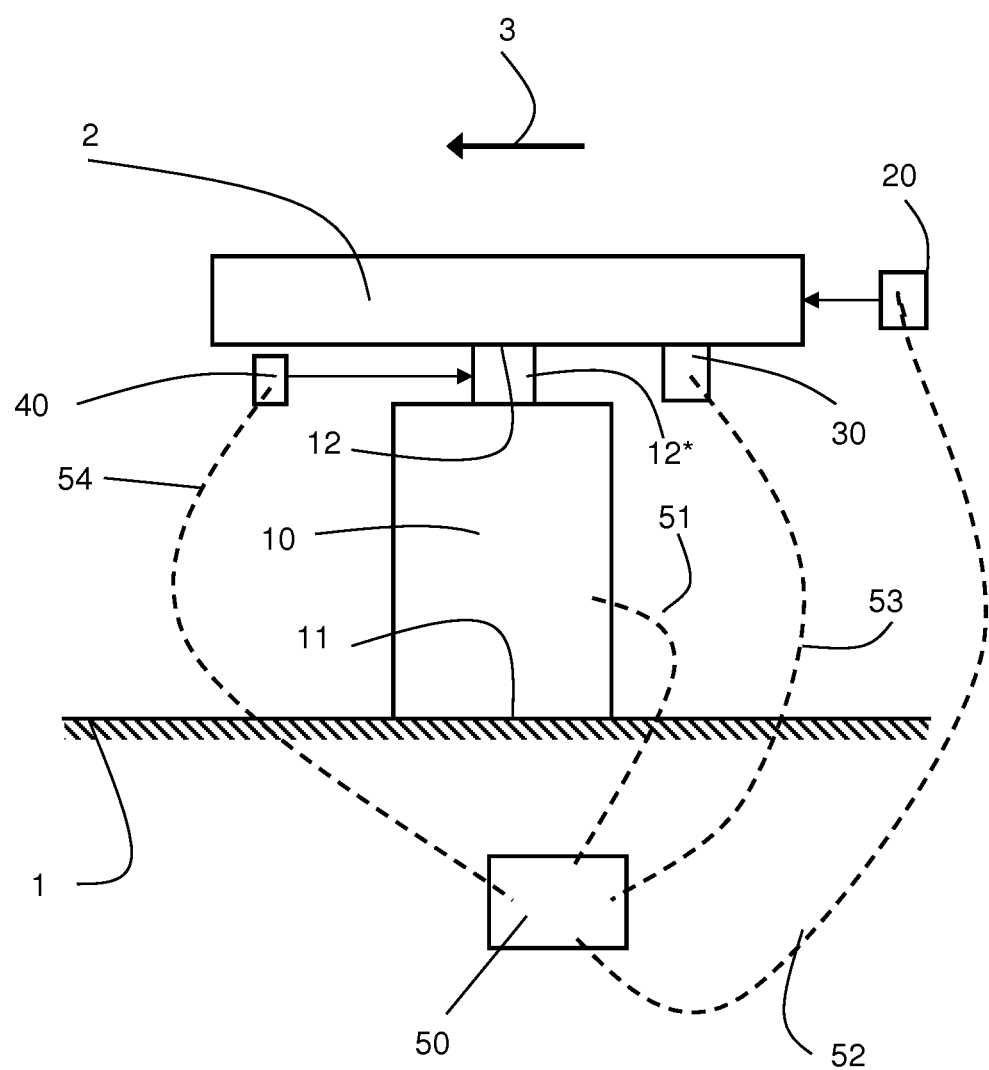
FIG. 3 schematically shows a possible embodiment of a positioning device according to the invention, FIG. 4 schematically shows the result of the second stage of the operating cycle of the positioning device of FIG. 3, FIG. 5 schematically shows the result of the fourth stage of the operating cycle of the positioning device of FIG. 3, FIG. 6 schematically shows the result of the first repetition of the second stage of the operating cycle of the positioning device of FIG. 3, FIG. 7 schematically shows the result of the first repetition of the fourth stage of the operating cycle of the positioning device of FIG. 3, FIG. 8 schematically shows a further embodiment of a positioning device according to the invention, FIG. 9 schematically shows the result of the second stage of the operating cycle of the positioning device of FIG. 8, FIG. 10 schematically shows the result of the fourth stage of the operating cycle of the positioning device of FIG. 8, FIG. 11 schematically shows a variant of the positioning device according to the invention.

FIG. 3 schematically shows a possible embodiment of a positioning device according to the invention.

The positioning device according to FIG. 3 is configured to position body 2 relative to base 1 in first direction 3. Preferably, the positioning device is configured to position body 2 relative to base 1 in first direction 3 as well as in the direction opposite to the first direction 3. Optionally, the positioning device is configured to position body 2 relative to base 1 in a first translational degree of freedom.

When the positioning device according to FIG. 3 is applied in a lithographic apparatus, the body 2 may be part of the part of the projection system PS. The base 1 may be configured to support at least part of the projection system PS. The body 2 is for example an optical element such as a mirror or a lens. In another embodiment, the body 2 is for example a part of the projection system PS which is not an optical element, or the entire projection system PS, or the illuminator IL of a lithographic apparatus.

In a further embodiment, the body 2 is for example a sensor element of a sensor or a structural element onto which a sensor element of said sensor is mounted. The sensor element is optionally arranged in a lithographic apparatus. The sensor can for example comprise an interferometric device, an encoder-based device (comprising e.g. a linear encoder) or a capacitive sensor.

The sensor optionally comprises a first sensor element which is or comprises a sensor sender/receiver element and a second sensor element which is or comprises a sensor target element. If the sensor is an encoder based device, the sensor optionally comprises a grating, e.g. a one dimensional or two dimensional grating, and an encoder head. The encoder head may comprise a beam source and at least one receiver element which is adapted to received the beam from the grating.

If the sensor is interferometer based, the sensor comprises a first sensor element which is or comprises a mirror element, and a second sensor element which is or comprises a source for an optical beam and a receiver which is adapted to receive the beam from the mirror element. The source for the optical beam is arranged such that the optical beam strikes the mirror element.

When the positioning device according to FIG. 3 is applied in a lithographic apparatus, the base 1 is the part of the lithographic apparatus relative to which the body 2 has to be positioned in the first direction 3. The base 1 can for example be a sensor frame, a force frame, a base frame or a metrology frame.

The embodiment of FIG. 3 is not limited to use in a lithographic apparatus.

The positioning device as shown in FIG. 3 comprises a support 10 which supports the body 2 onto the base 1 in a direction perpendicular to the first direction 3. The support 10 may for example be the vibration isolation system IS and/or a gravity compensator. The support 10 has a body engaging surface 12 and a base engaging surface 11 which are moveable relatively to each other in the first direction 3, and optionally also in a direction opposite the first direction 3. The base engaging surface 11 is coupled to the base 1, at least in the degree of freedom corresponding to the first direction 3. If the base 1 moves in or opposite the first direction 3, the base engaging surface 11 of the support 10 moves along with the base 1.

The support 10 has a coupled state in which the body engaging surface 12 is coupled to the body 2, at least in the degree of freedom corresponding to the first direction 3. If the body 2 moves in or opposite the first direction 3, the body engaging surface 12 of the support 10 moves along with the body 2.

The support 10 also has an uncoupled state in which the body engaging surface 12 is moveable relatively to the body 2, at least in the degree of freedom corresponding to the first direction 3. In the uncoupled state, the base engaging surface 11 remains coupled to base 1, at least in the degree of freedom corresponding to the first direction 3.

The body engaging surface 12 may be provided on a body engagement member 12* which forms part of the support 10. The base engaging surface 11 may be provided on a base engagement member which forms part of the support 10, or it may be a surface of e.g. a housing of the support 10.

The positioning device of FIG. 2 further comprises a forward actuator 20. The forward actuator 20 is configured to move the body 2 and the body engaging surface 12 together relative to the base 1 in the first direction 3 over a forward stroke length when the support 10 is in the coupled state. During this movement the body engaging surface 12 is moved from a first initial position to an end position. Because the support 10 is in the coupled state, the body 2 and the body engaging surface 12 move along together along the forward stroke. The forward actuator 20 may act on the body 2, on a structural element that is connected to the body 2 or on the support 10 during at least a part of the movement along the forward stroke. The forward actuator may be a structural element that is connected to the body 2 or the support 10 during at least a part of the movement along the forward stroke. Optionally, the length of the forward stroke is variable. In that case, when the forward stroke is repeated in a subsequent operational cycle, the end position can be at a different location as compared to the end position in a previous operating cycle.

The positioning device of FIG. 2 further comprises a body holder 30. The body holder 30 has a fixed state in which the body holder 30 fixates the position of the body 2 relative to the base 1 in at least the first direction 3, and optionally also in the direction opposite to the first direction 3. The body holder 30 further has an unfixed state in which the body holder 30 allows movement of the body 2 relative to the base 1 in the first direction, and optionally also in the direction opposite to the first direction 3. The body holder 30 optionally also fixates the position of the body 2 relatively to the base 1 in a direction perpendicular to the first direction 3, for example in a vertical direction.

In a possible embodiment, the body holder 30 actively clamps the body 2 into position when the body holder 30 is in the fixed state. Alternatively or in addition, the body holder 30 may fixate the body 2 in position relative to the base 1 by gravity. The body holder 30 can for example be a part of the base frame BF of a lithographic apparatus.

The positioning device of FIG. 2 further comprises a return device 40. The return device 40 is configured to move the body engaging surface 12 relative to the body 2 opposite to the first direction 3 over a rearward stroke length when the support 10 is in the uncoupled state. During this movement the body engaging surface 12 is moved back from the end position to a second initial position. The second initial position may be the same as the first initial position, or the second initial position may be different from the first initial position. Because the support 10 is in the uncoupled state, the body 2 does not move back with the body engaging surface 12 when the return device 40 brings the body engaging surface 12 back from the end position to the second initial position. The length of the rearward stroke may be the same as or different from the length of the forward stroke. If the rearward stroke has the same length as the forward stroke, the second initial position is the same as the first initial position. If the rearward stroke has a different length than the forward stroke, the second initial position is different from the first initial position.

The return device 40 can be a separate device, for example a dedicated actuator or a spring. Alternatively, the return device 40 can be an elastic or elastically mounted element of the support 10, for example an elastic or spring mounted element onto which a body engaging member 12* with the body engaging surface 12 is mounted. When the return device 40 uses elasticity to return the body engaging surface 12 to its second initial position, the return device 40 may be activated simply by bringing the support 10 into the uncoupled state. In a possible embodiment, the forward actuator 20 and the return device 40 are combined into a single actuator which provides both the forward stroke and the rearward stroke, e.g. a reciprocating actuator.

The positioning device of FIG. 3 further comprises a controller 50 which is configured to control movements and switching from one state to another of elements in the positioning device.

In the embodiment of FIG. 3, the controller 50 is configured to subsequently:

bring the support 10 into the coupled state and the body holder 30 into the unfixed state, then, activate the forward actuator 20 to move the body 2 and the body engaging surface 12 together relative to the base 1 in the first direction 3 over a forward stroke length, and therewith to bring the body engaging surface 12 from the first initial position to the end position, then, bring the body holder 30 into the fixed state, then, bring the support 10 into the uncoupled state, then, activate the return device 40 to move the body engaging surface 12 relative to the body 2 opposite to the first direction 3 over a rearward stroke length, and therewith to bring the body engaging surface back 12 from the end position to the second initial position.

The operational cycle may be repeated one or more times. Optionally, the length of the forward stroke and/or the length of the rearward stroke may be variable between one operating cycle and the next. This allows to move the body 2 relatively to the base 1 over any desired distance, even if this distance is not equal to N times the length of the forward stroke, N being an integer.

The controller 50 for example comprises a processor which may be arranged in a controller housing. The controller 50 may comprise a memory. The controller 50 may be or comprise a computer.

In the positioning device of FIG. 3, the controller 50 is connected to the support 10 by a control connection 51. This control connection 51 can be a wired or wireless control connection. The controller 50 has an connector terminal to which the control connection 51 is connected.

In the positioning device of FIG. 3, the controller 50 is connected to the forward actuator 20 by a control connection 52. This control connection 52 can be a wired or wireless control connection. The controller 50 has an connector terminal to which the control connection 52 is connected.

In the positioning device of FIG. 3, the controller 50 is connected to the body holder 30 by a control connection 53. This control connection 53 can be a wired or wireless control connection. The controller 50 has an connector terminal to which the control connection 53 is connected.

In the positioning device of FIG. 3, the controller 50 is connected to the return device 40 by a control connection 54. This control connection 54 can be a wired or wireless control connection. The controller 50 has an connector terminal to which the control connection 54 is connected.

FIG. 3 shows the initial situation of the positioning device, for example before the positioning device has been activated. The first stage in the operating cycle of the position device of FIG. 3 is that the controller 50 brings the support 10 into the coupled state and the body holder 30 into the unfixed state. No movements in or opposite to the first direction 3 take place yet, so the relative position in the first direction 3 of the body 2 and the base 1 remains unchanged, as does the relative position of the body engaging surface 12 and the base engaging surface 11.

In the second stage of the operating cycle of the positioning device of FIG. 3, the controller 50 activates the forward actuator 20 to move the body 2 and the body engaging surface 12 together relative to the base 1 in the first direction 3 over a forward stroke length. The body engaging surface 12 is thus brought from the first initial position to the end position. The result of this is shown in FIG. 4: both the body 2 and the body engaging surface 12 (which forms part of the body engaging member 12*) have been moved in the first direction 3 over a forward stroke S.

In the third stage of the operating cycle of the positioning device of FIG. 4, the controller 50 brings the body holder 30 into the fixed state, and subsequently the support 10 is brought into the uncoupled state by the controller 50. The relative position of the body 2 and the base 1 and the relative position of the body engaging surface 12 and the base engaging surface 11 remains the same as shown in FIG. 4.

Figure 4:
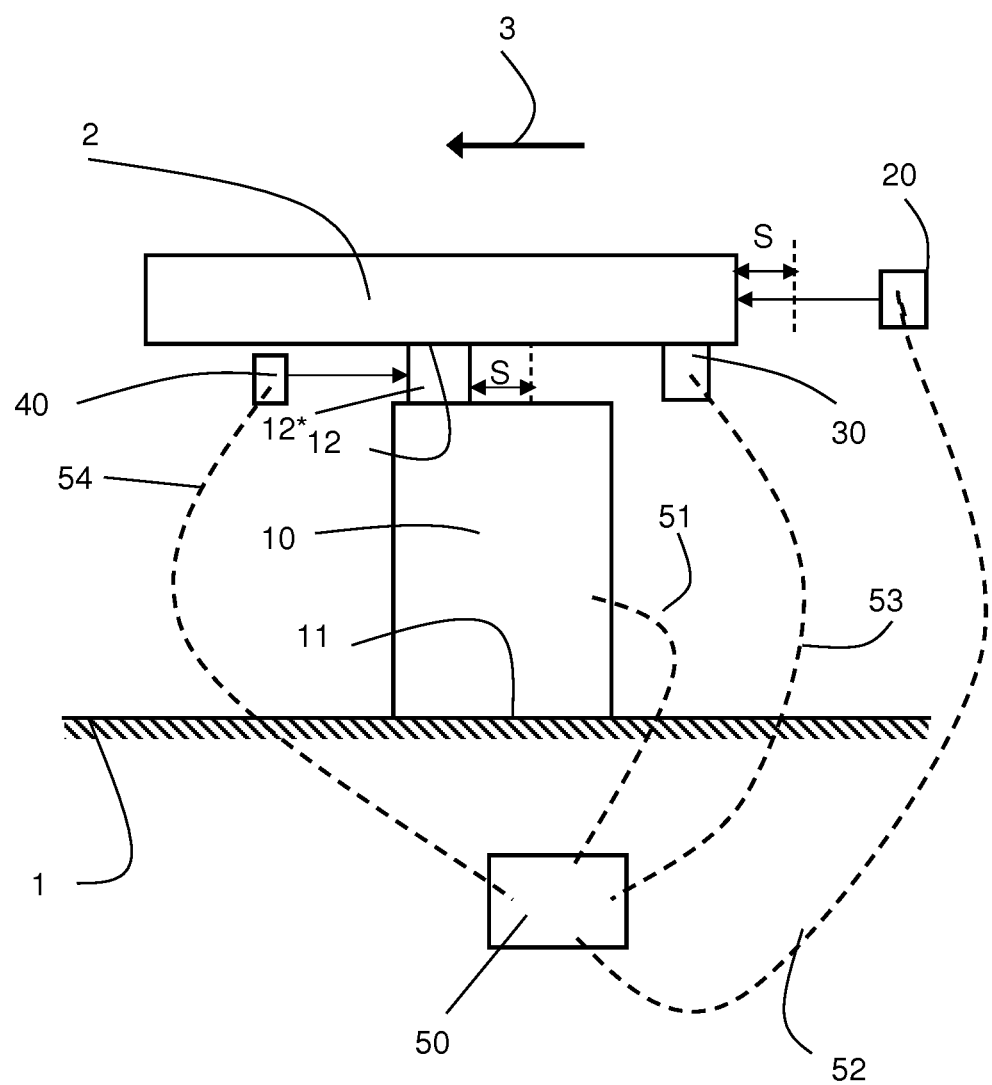
Figure 5:
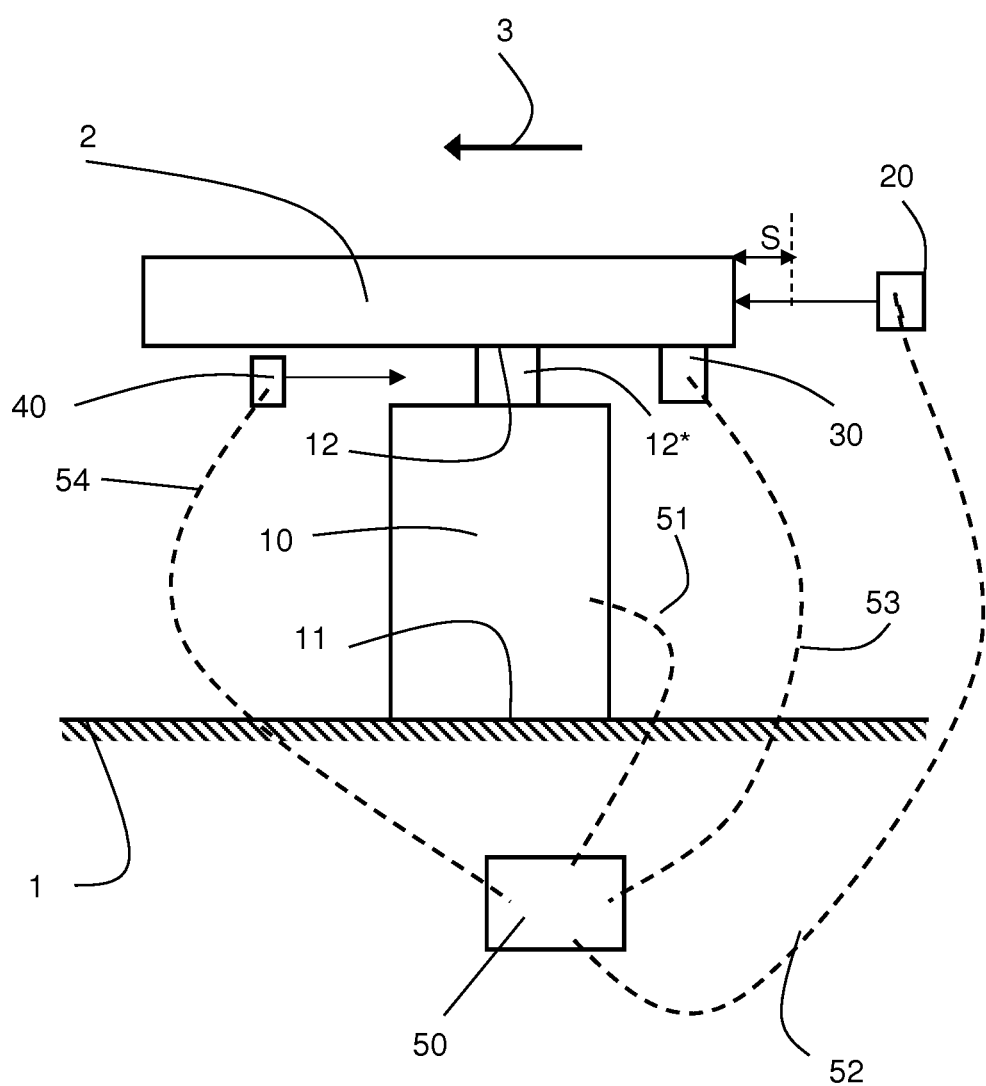

In the fourth stage of the operating cycle of the positioning device of FIG. 4, the controller 50 activates the return device 40 to move the body engaging surface 12 relative to the body 2 opposite to the first direction 3 over a rearward stroke length. Therewith, the body engaging surface 12 is brought back from the end position to the second initial position. The result of this is shown in FIG. 5: the body engaging surface 12 (which forms part of the body engaging member 12*) has been moved opposite to the first direction 3 over a rearward stroke back into the second initial position, while the body 2 remains in the position it was brought into by the forward stroke of the forward actuator. In this example, the second initial position is the same as the first initial position.

In a possible embodiment, the body engagement member 12* is in an equilibrium position when it is in its first and/or second initial position, so when the body engagement member 12* is in the first and/or second initial position, the body engagement member 12* does not exert a force on the body 2. In this embodiment, for example after finishing the operational cycle of the positioning device, the body engaging surface 12 has returned to the equilibrium position, so does not exert a force onto the body 2 in the first direction 3. This reduces the deformation of the body 2, and therewith improves the position accuracy that can be obtained for the body 2.

In a possible embodiment, the controller 50 is configured to repeat the operational cycle at least once, in order to allow the body 2 to be moved relatively to the base 1 over a distance which is larger than the forward stroke.

Figure 6:
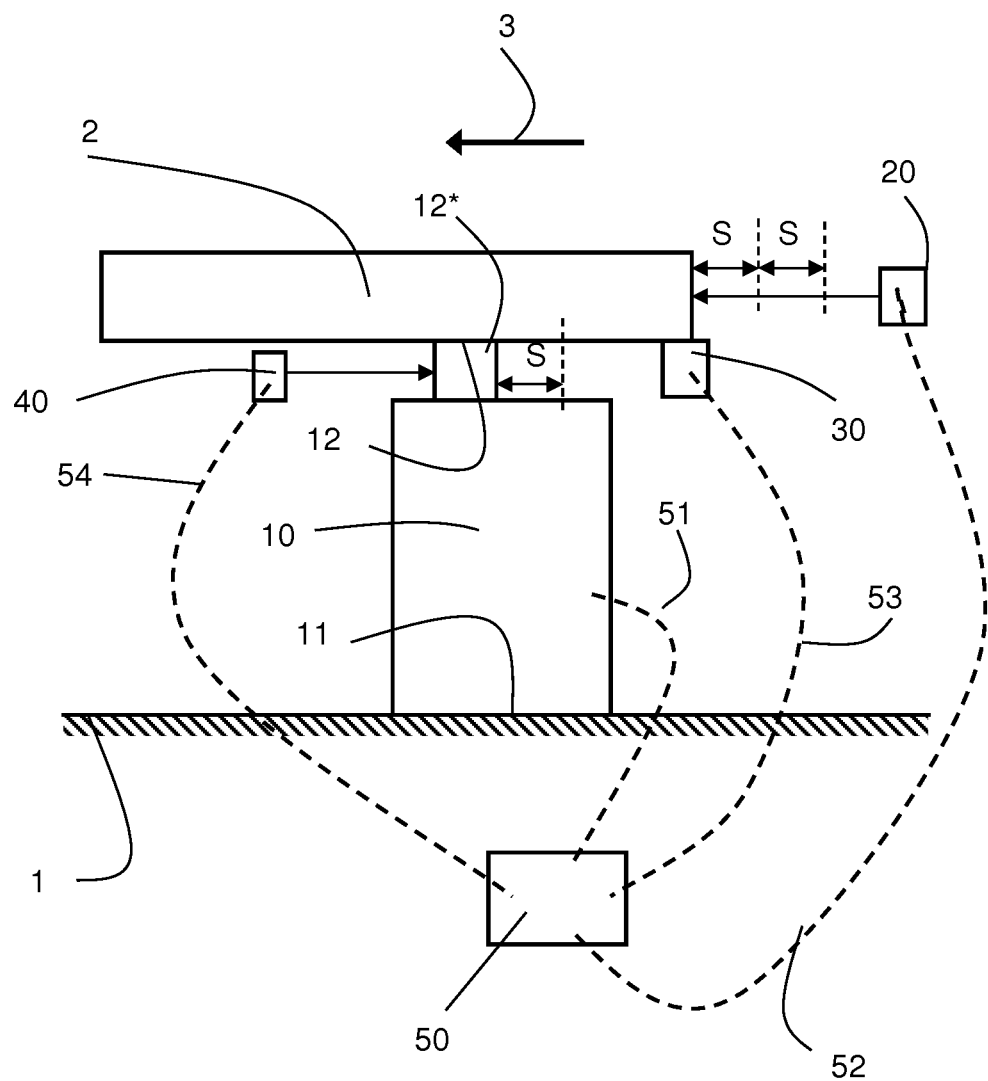

FIG. 6 shows the result of the first repetition of the second stage of the operating cycle of the positioning device of FIG. 3. The controller 50 has activated the forward actuator 20 for the second time to move the body 2 and the body engaging surface 12 together relatively to the base 1 in the first direction 3 over another forward stroke length S, which is in this example the same as the forward stroke length in the previous operating cycle. The body engaging surface 12 is again brought from the first initial position to the end position. The end position of this repetition of the second stage is the same as the end position during the first time the second stage of the operation cycle was carried out. So, while the body 2 moves relatively to the base 1 over a larger distance than the forward stroke S is long, the body engaging surface 12 does not. Optionally, if movement over a distance which is less then twice the length of forward stroke S is desired, a different forward stroke length S may be used in the second operating cycle than in the first operating cycle. The end position in the first operation cycle is then different from the end position in the second operating cycle.

FIG. 6 shows the result of the first repetition of the fourth stage of the operating cycle of the positioning device of FIG. 2. The controller 50 has activated the return device 40 for the second time to move the body engaging surface 12 relative to the body 2 opposite to the first direction 3 over a rearward stroke length. Therewith, the body engaging surface back 12 is brought back from the end position to the second initial position. The body 2 remains in the position it was brought into by the second forward stroke of the forward actuator.

The embodiment allows to move the body 2 over a larger distance relative to the base 2 that the length of the forward stroke S of the forward actuator. This allows to use a relatively small forward actuator with a limited stroke length, while still being able to move the body 2 over a relatively large distance relative to the base 1.

When applying a positioning device in accordance in FIG. 2 in a lithographic apparatus, it suffices to roughly position the body 2 relative to the base 1 during the assembly of the lithographic apparatus. The large displacement of the body 2 relative to the base 1 that is made possible by the positioning device according to the invention, makes accurate positioning over a large positioning range possible.

In a possible embodiment, the forward actuator 20 is configured to move the body 2 and the body engaging surface 12 together relatively to the base 1 also opposite to the first direction 3 over an opposite forward stroke length when the support 10 is in the coupled state. During this movement the body engaging surface 12 is moved from a first initial position to a second end position, which is located at a distance from the first initial position in a direction that is opposite to the first direction. Because the support 10 is in the coupled state, the body 2 and the body engaging surface 12 move along together along the opposite forward stroke. The forward actuator 20 may act on the body 2, a structural element that is connected to the body 2 or the support 10 during at least a part of the movement along the opposite forward stroke.

In this embodiment, the return device 40 is configured to move the body engaging surface 12 relative to the body 2 in the first direction 3 over an opposite rearward stroke length when the support 10 is in the uncoupled state. During this movement the body engaging surface 12 is moved back from the second end position to a second initial position. Because the support 10 is in the uncoupled state, the body 2 does not move back with the body engaging surface 12 when the return device 40 brings the body engaging surface 12 back from the second end position to the second initial position. The second initial position may be the same as or different from the first initial position.

Figure 7:
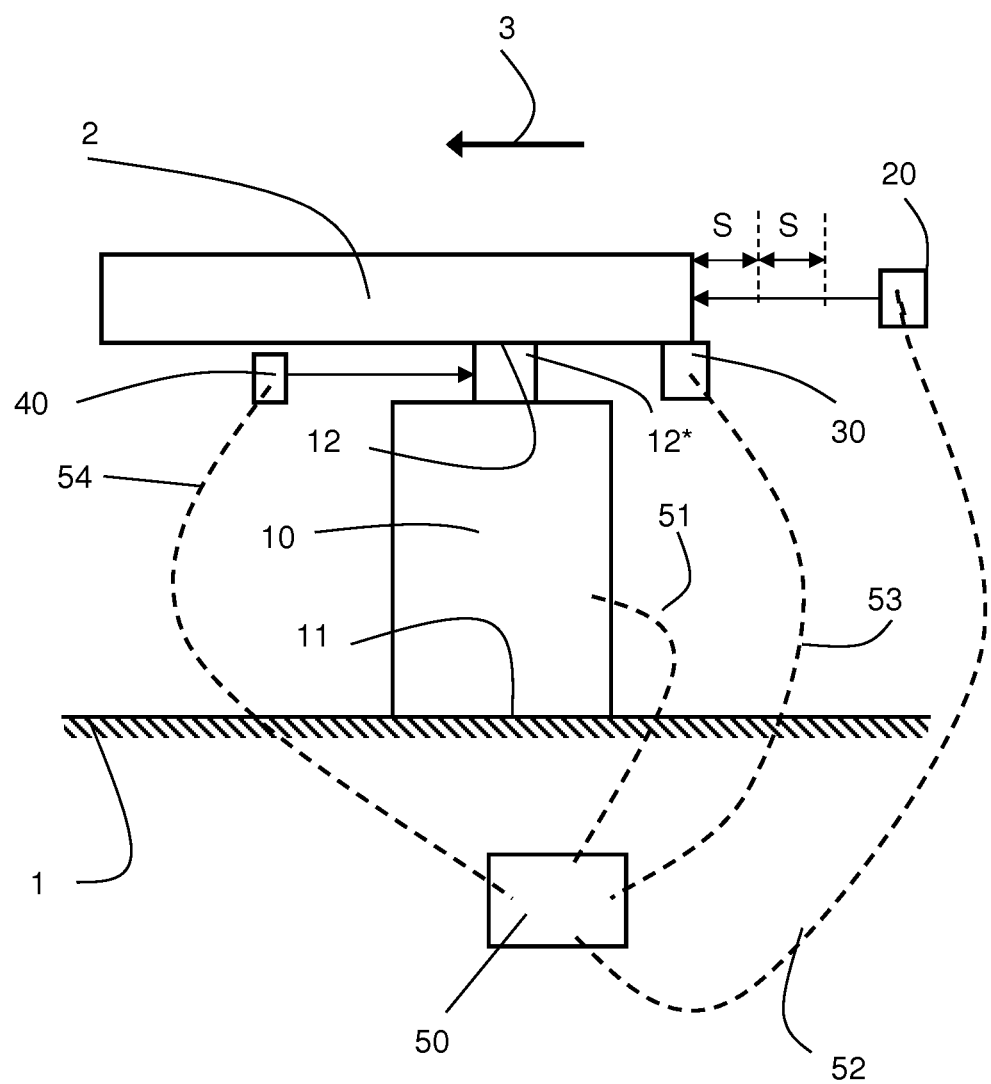
Figure 8:
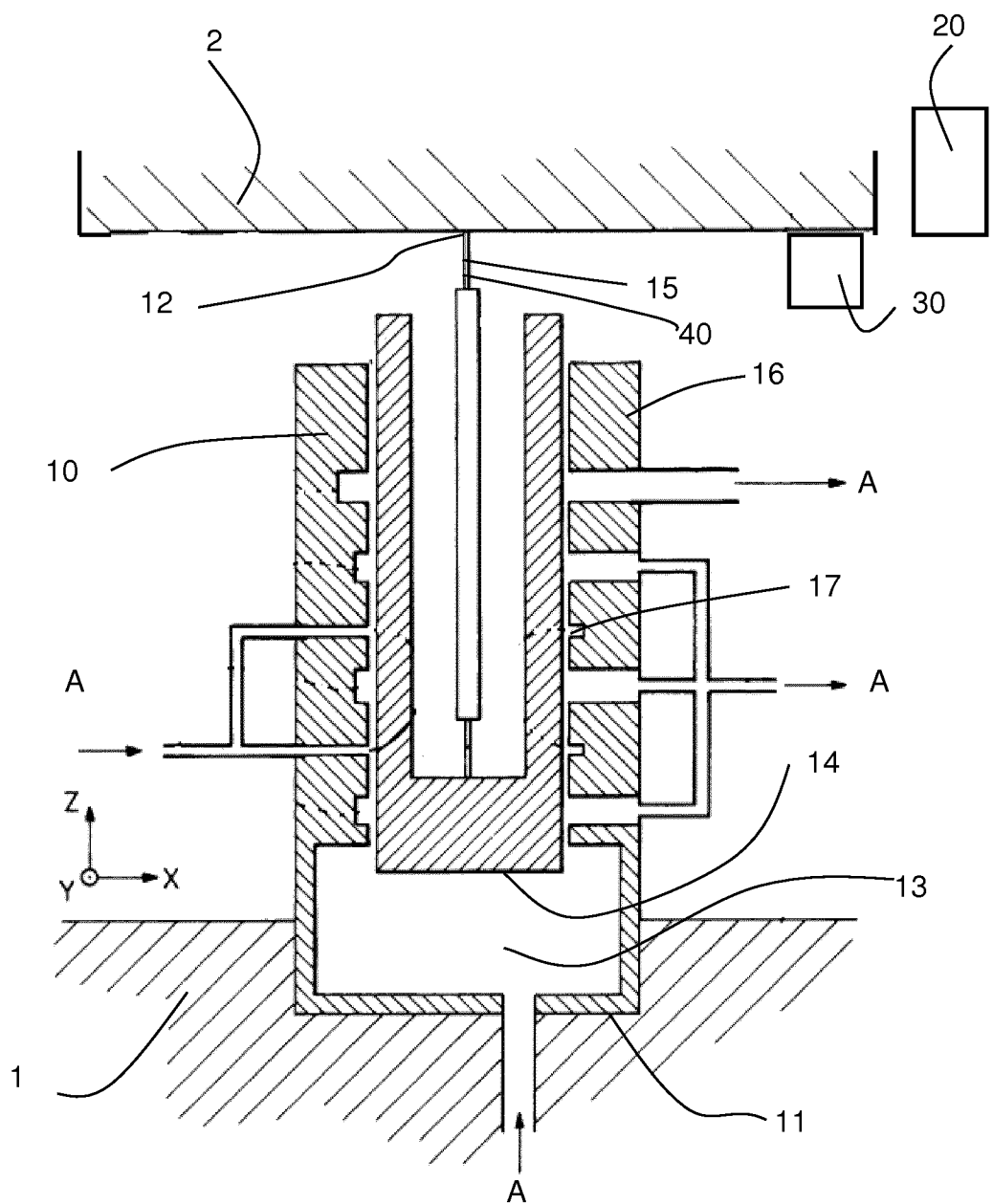

FIG. 8 schematically shows a further embodiment of a positioning device according to the invention. Identical reference numerals indicate features having the same functionality as in the embodiment of FIGS. 3-7.

FIG. 8 schematically shows the vibration isolation system IS, arranged for supporting the body 2 onto the base 1. The vibration isolation system IS comprises the support 10, the forward actuator 20 and the return device 40. The support 10 is for supporting the body 2 onto the base 1. The support 10 has the body engaging surface 12 and the base engaging surface 11. The base engaging surface 11 is arranged to couple to the base 1. The support 10 is arranged to couple the body engaging surface 12 to the body 2 in a coupled state. The support 10 is arranged to uncouple the body engaging surface 12 from the body 2 in an uncoupled state. The forward actuator 20 is configured to move of the body 2 and the body engaging surface 12 together relatively to the base 1 in the first direction 3 from a first initial position to an end position in the coupled state. The return device 40 is configured to move the body engaging surface 12 relatively to the body 2 opposite to the first direction 3 from the end position to a second initial position in the uncoupled state.

The second initial position may be closer to the first initial position than the end position is to the first initial position.

The vibration isolation system IS may comprise the body holder 30 arranged to support the body 2 in the uncoupled state. The body holder 30 may be arranged to fixate a position of the body 2 and the base 1 relatively to each other in the uncoupled state. The body holder 30 may be arranged to allow movement of the body 2 relatively to the base 1 in the first direction in the coupled state.

The embodiment of FIG. 8 can for example be applied in a lithographic apparatus, but it is not limited to this use.

In the embodiment of FIG. 8, the support 10 is part of the vibration isolation system IS. The support part 10 may be a pneumatic gravity compensator. The support 10 comprises a gas chamber 13 and a piston 14. The piston 14 is moveable within a housing 16. An gas bearing system 17 allows for smooth movement of the piston 14 in the housing 16. The lower surface of the housing 16 forms the base engaging surface 11. The arrows A in FIG. 8 indicate the flow of gas through the gas chamber 13 and the gas bearing system 17.

In FIG. 8, the controller 50 is not shown for reasons of clarity, but a controller 50 is provided in this embodiment, for example in the same way as in the embodiment of FIG. 3. Likewise, the control connections between the controller 50 and the support 10, the forward actuator 20, the body holder 30 and if necessary the return device 40, respectively are provided in the embodiment of FIG. 8. The body holder 30 may be arranged on the housing 16. The forward actuator 20 may be arranged on the housing 16.

The vibration isolation system IS may comprise the controller 50 which is configured to, in an operating cycle, subsequently:
  bring the support 10 into the coupled state,
  then, activate the forward actuator 20 to move the body 2 and the body engaging surface 12 together relatively to the base 1 in the first direction 3 from the first initial position to the end position,
  then, bring the support 10 into the uncoupled state,
  then, activate the return device 40 to move the body engaging surface 12 relatively to the body 2 opposite to the first direction 3 from the end position to the second initial position.

The gas used in the gas chamber 13 and in the gas bearing 17 may be air, nitrogen, helium or any other type of suitable gas or suitable combination of gases.

In the embodiment of FIG. 8, a flexible rod 15 is provided. The flexible rod 15 has a first end which is connected to the piston 14 and a second end which contains the body contact surface 12. The flexible rod 15 therewith connects the piston 14 and the body engaging surface 12 with each other.

In the embodiment of FIG. 8, the flexible rod 15 is an elastic member which forms the return device 40.

The flexible rod 15 is straight when the body engaging surface 12 is in the first initial position. When the body engaging surface 12 is moved to the end position by the forward actuator 20, the flexible rod 15 will bend elastically, for example as shown in FIG. 8. If then the support 10 is brought into the uncoupled state, the flexible rod 15 will—due to its elasticity—return to its straight shape, which results in the body engaging surface 12 being returned to the second initial position, which in this embodiment is the same as the first initial position. The second initial position is closer to the first initial position than the end position is to the first initial position.

In a possible embodiment, the flexible rod 15 is provided with a "negative stiffness", which means that it is biased towards the end position of the forward stroke rather than to any initial position. In this embodiment, the return device comprises a return actuator. The body engaging surface 12 is actively returned to an initial position, e.g., the second initial position, by the return actuator.

In a possible variant of the embodiment of FIG. 8, the return device 40 is further configured to move the body engaging surface 12 away from the body 2 prior to moving the body engaging surface 12 opposite to the first direction 3 during the rearward stroke. For example, the body engaging surface 12 is moved away in a direction perpendicular to the first direction 3 before the body engaging surface 12 is moved opposite to the first direction 3 back towards the second initial position. As a result, the body engaging surface 12 does not contact the body 2 during the rearward stroke. This reduces the risk of particle generation during the rearward stroke, which is in particular advantageous when the positioning device according to the invention is applied in a lithographic apparatus. This variant can also be used in combination with other embodiments of the invention, for example in combination with the embodiment of FIG. 3.

In a possible embodiment of the positioning device according to the invention, the body engaging surface 12 and the base engaging surface 11 are moveable relatively to each other perpendicular to the first direction 3. This is for example the case in the embodiment of FIG. 7. By changing the volume of gas in the gas chamber 13, the piston 14 can be moved down or up, and the body engaging surface 12 can be moved away from or towards the body 2. This is a convenient way of making sure that the body engaging surface 12 does not contact the body 2 during the rearward stroke.

FIG. 8 shows the initial situation of the positioning device according to this specific embodiment, for example before the positioning device has been activated. The first stage in the operating cycle of the position device of FIG. 8 is that the controller 50 brings the support 10 into the coupled state and the body holder into the unfixed state. The body holder 30 is for example a part of the base frame of the lithographic apparatus, or attached to such base frame. No movements take place yet, so the relative position of the body 2 and the base 1 remains unchanged, as does the relative position of the body engaging surface 12 and the base engaging surface 11.

Figure 9:
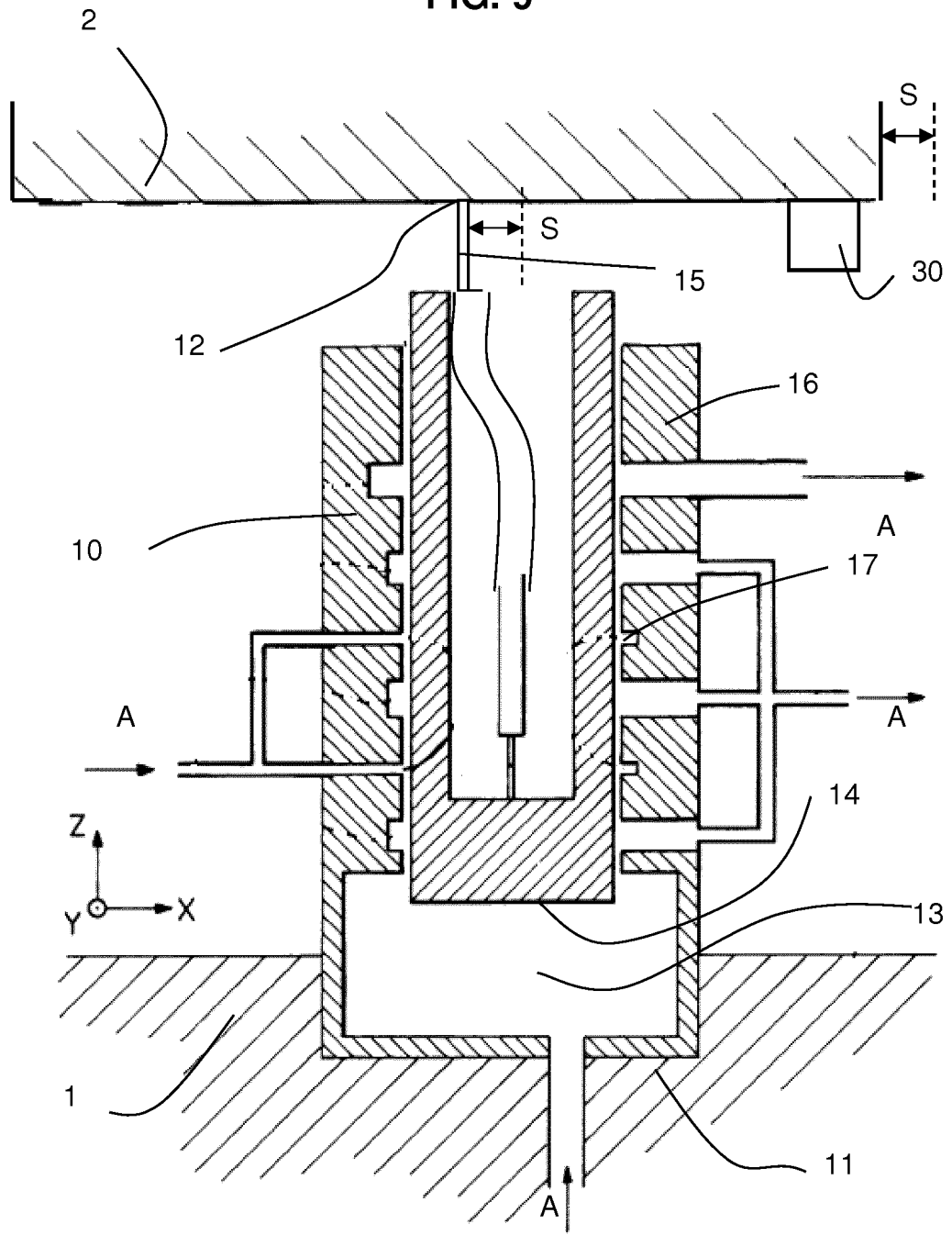

In the second stage of the operating cycle of the positioning device of FIG. 8, the controller 50 activates the forward actuator 20 to move the body 2 and the body engaging surface 12 together relatively to the base 1 in the first direction 3 over a forward stroke length. The body engaging surface 12 is thus brought from the first initial position to the end position. The result of this is shown in FIG. 9: both the body 2 and the body engaging surface 12 (which forms part of the body engaging member 12*) have been moved in the first direction 3 over a forward stroke S.

In the third stage of the operating cycle of the positioning device of FIG. 8, the controller 50 brings the body holder 30 into the fixed state, and subsequently the support 10 is brought into the uncoupled state by the controller 50. The relative position of the body 2 and the base 1 and the relative position of the body engaging surface 12 and the base engaging surface 11 remains the same as shown in FIG. 9.

Figure 10:
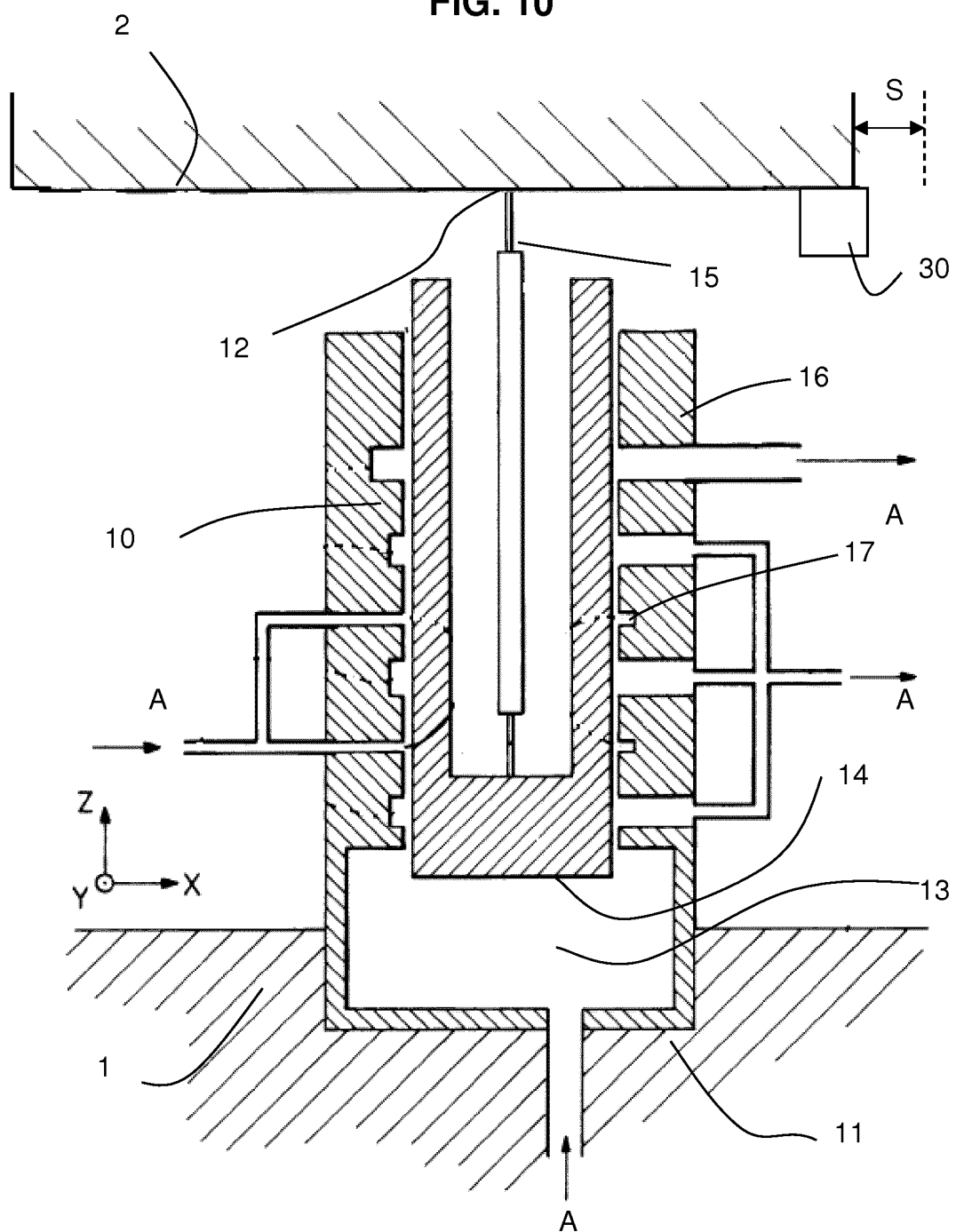

In the fourth stage of the operating cycle of the positioning device of FIG. 7, the controller 50 activates the return device 40 to move the body engaging surface 12 relative to the body 2 opposite to the first direction 3 over a rearward stroke length. Therewith, the body engaging surface back 12 is brought back from the end position to the second initial position, which in this example is the same as the first initial position. The result of this is shown in FIG. 10: the body engaging surface 12 (which forms part of the body engaging member 12*) has been moved opposite to the first direction 3 over a rearward stroke back into its second initial position, while the body 2 remains in the position it was brought into by the forward stroke of the forward actuator.

Figure 11:
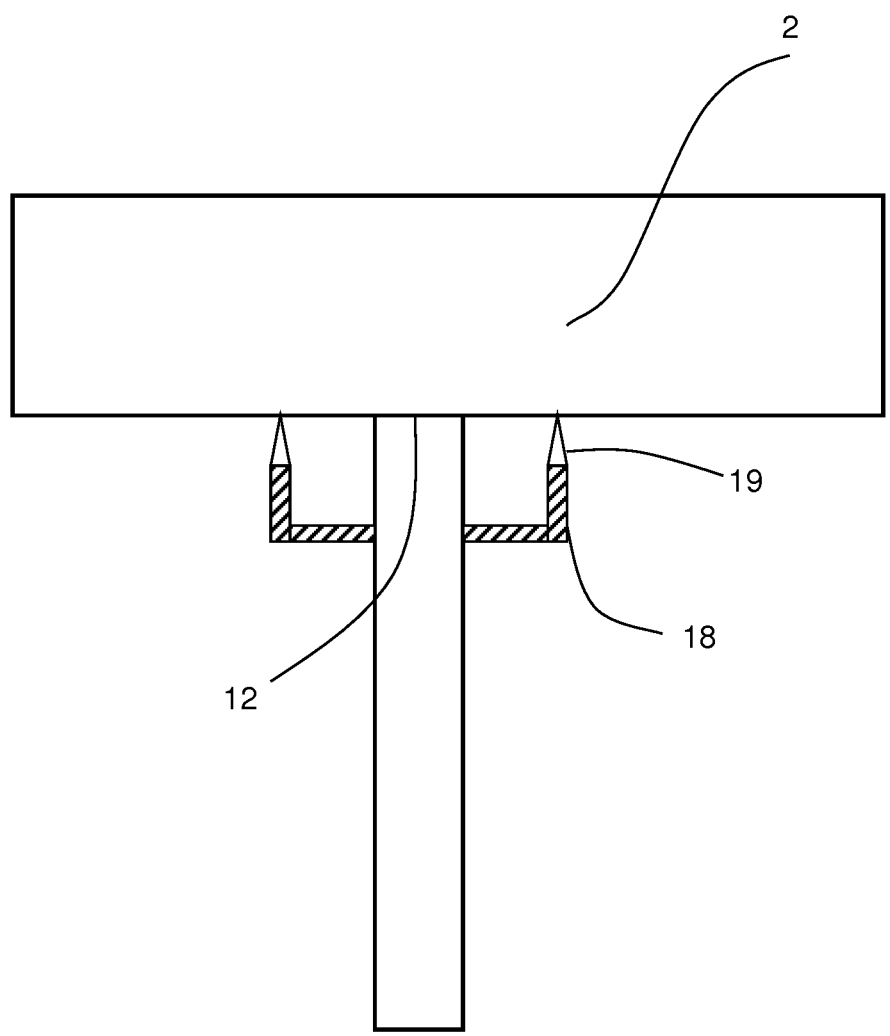

FIG. 11 schematically shows a variant of the positioning device according to the invention (positioning device is only shown in part in FIG. 11). In this variant, vibration isolation system IS is provided with a particle shield 18 which extends around the circumference of the body engaging surface 12. The particle shield 18 is shown in FIG. 11 in cross section.

When the body engaging surface 12 slides over the body 2, for example during the rearward stroke, particles may be generated. Such particles may contaminate the atmosphere in the vicinity of the body 2 and the base 1. This can be a problem for example when positioning device is used in an atmosphere which has to meet strict requirements with respect to cleanliness, for example in a clean room or inside a lithographic apparatus.

In this variant, particles that are generated when the body engaging surface 12 slides over the body 2, are contained within the particle shield 18 so they do not escape to the atmosphere.

Optionally, the particle shield 18 comprises a seal 19 which engages the body 2. The material of the seal 19 is selected in such a way that a minimum amount of loose particles is generated when the seal 19 slides over the body 2. Alternatively, no seal is provided, but instead a narrow gap is present between the particle shield 18 and the body 2, in order to create a labyrinth-like seal through which particles can not or hardly escape from the space within the particle shield.

The particle shield 18 (either with or without the seal 19) can be used in for example the embodiment of FIG. 3 and the embodiment of FIG. 8.

In an embodiment, there is provided a vibration isolation system, arranged for supporting a body onto a base, the vibration isolation system comprising: a support for supporting the body onto the base, wherein the support has a body engaging surface and a base engaging surface, wherein the base engaging surface is arranged to couple to the base, wherein the support is arranged to couple the body engaging surface to the body in a coupled state, wherein the support is arranged to uncouple the body engaging surface from the body in an uncoupled state; a forward actuator configured to move the body and the body engaging surface together relatively to the base in a first direction from a first initial position to an end position in the coupled state; and a return device configured to move the body engaging surface relatively to the body opposite to the first direction from the end position to a second initial position in the uncoupled state.

In an embodiment, the second initial position is closer to the first initial position than the end position is to the first initial position. In an embodiment, the vibration isolation system comprises a body holder arranged to support the body in the uncoupled state, wherein the body holder is arranged to fixate a position of the body and the base relatively to each other in the uncoupled state, and wherein the body holder is arranged to allow movement of the body relatively to the base in the first direction in the coupled state. In an embodiment, the vibration isolation system comprises a controller which is configured to, in an operating cycle, subsequently: bring the support into the coupled state; then, activate the forward actuator to move the body and the body engaging surface together relatively to the base in the first direction from the first initial position to the end position, then, bring the support into the uncoupled state, and then, activate the return device to move the body engaging surface relative to the body opposite to the first direction from the end position to the second initial position. In an embodiment, the return device comprises a flexible rod, which is connected to or provided With the body engaging surface. In an embodiment, the support comprises a piston and a piston housing, wherein the piston is arranged in the piston housing, wherein the piston housing is connected to or comprises the base engaging surface, and wherein the piston is connected to the body engaging surface. In an embodiment, the return device comprises a return actuator. In an embodiment, the return device is configured to move the body engaging surface away from the body prior to moving the body engaging surface opposite to the first direction. In an embodiment, the vibration isolation system comprises a particle shield which extends around the circumference of the body engaging surface. In an embodiment, the body engaging surface and the base engaging surface are moveable relatively to each other perpendicular to the first direction. In an embodiment, the controller is configured to sequentially perform multiple operational cycles.

In an embodiment, there is provided lithographic apparatus, comprising a vibration isolation system as described herein. In an embodiment, the lithographic apparatus comprises at least one of an optical element and a sensor element, and wherein the body comprises the at least one of the optical element and the sensor element. In an embodiment, the lithographic apparatus comprises a projection system configured to project a patterned radiation beam onto a substrate, Wherein the base is configured to support at least a part of the projection system, and wherein the body comprises the part of the projection system. In an embodiment, the lithographic apparatus comprises a vacuum chamber, and wherein the body is arranged in the vacuum chamber.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A vibration isolation system, arranged for supporting a body on a base, the vibration isolation system comprising:
   a support for supporting the body on the base, wherein the support has a body engaging surface,
   wherein the support is arranged to couple the body engaging surface to the body in a coupled state, and
   wherein the support is arranged to uncouple the body engaging surface from the body in an uncoupled state;
   a forward actuator configured to move the body and the body engaging surface together relatively to the base in a first direction from a first initial position to an end position in the coupled state; and
   a return device configured to move the body engaging surface relatively to the body opposite to the first direction from the end position to a second initial position in the uncoupled state.

2. The vibration isolation system of claim 1, wherein the second initial position is closer to the first initial position than the end position is to the first initial position.

3. The vibration isolation system of claim 1, further comprising a body holder arranged to support the body in the uncoupled state, wherein the body holder is arranged to fixate a position of the body and the base relatively to each other in the uncoupled state, and wherein the body holder is arranged to allow movement of the body relatively to the base in the first direction in the coupled state.

4. The vibration isolation system of claim 1, further comprising a controller configured to, in an operating cycle:
   bring the support into the coupled state,
   then, activate the forward actuator to move the body and the body engaging surface together relatively to the base in the first direction from the first initial position to the end position,
   then, bring the support into the uncoupled state,
   then, activate the return device to move the body engaging surface relative to the body opposite to the first direction from the end position to the second initial position.

5. The vibration isolation system of claim 4, wherein the controller is configured to sequentially perform multiple operational cycles.

6. The vibration isolation system of claim 1, wherein the return device comprises a flexible rod, which is connected to or provided with the body engaging surface.

7. The vibration isolation system of claim 1, wherein the support further comprises a piston and a piston housing, wherein the piston is arranged in the piston housing, wherein the piston housing is connected to or comprises a base engaging surface of the support, the base engaging surface arranged to couple to the base, and wherein the piston is connected to the body engaging surface.

8. The vibration isolation system of claim 1, wherein the return device comprises a return actuator.

9. The vibration isolation system of claim 1, wherein the return device is configured to move the body engaging surface away from the body prior to moving the body engaging surface opposite to the first direction.

10. The vibration isolation system of claim 1, further comprising a particle shield which extends around a periphery of the body engaging surface.

11. The vibration isolation system of claim 1, wherein the body engaging surface and a base engaging surface of the support, the base engaging surface arranged to couple to the base, are moveable relatively to each other perpendicular to the first direction.

12. A lithographic apparatus, comprising the vibration isolation system according to claim 1.

13. The lithographic apparatus according to claim 12, further comprising an optical element and/or a sensor element, and wherein the body comprises the optical element and/or the sensor element.

14. The lithographic apparatus according to claim 12, further comprising a projection system configured to project a patterned radiation beam onto a substrate, wherein the base is configured to support at least a part of the projection system, and wherein the body comprises the part of the projection system.

15. The lithographic apparatus according to claim 12, further comprising a vacuum chamber, and wherein the body is arranged in the vacuum chamber.

16. A non-transitory computer-readable medium comprising instructions therein, the instructions, upon execution by a computer system, configured to cause the computer system to at least cause, in an operating cycle:

bringing of a support into a coupled state, wherein the support is for supporting a body on a base, wherein the support has a body engaging surface, wherein the support is arranged to couple the body engaging surface to the body in the coupled state, wherein the support is arranged to uncouple the body engaging surface from the body in an uncoupled state, and wherein the bringing of the support into the coupled state includes activating of a forward actuator to move the body and the body engaging surface together relatively to the base in a first direction from a first initial position to an end position in the coupled state; and then, bringing of the support into the uncoupled state including activating of a return device to move the body engaging surface relative to the body opposite to the first direction from the end position to a second initial position in the uncoupled state.

17. The computer-readable medium according to claim 16, wherein the second initial position is closer to the first initial position than the end position is to the first initial position.

18. The computer-readable medium according to claim 16, wherein the instructions are configured to cause the computer system to at least cause the return device to move the body engaging surface away from the body prior to moving the body engaging surface opposite to the first direction.

19. The computer-readable medium according to claim 16, wherein the body engaging surface and a base engaging surface of the support, the base engaging surface arranged to couple to the base, are moveable relatively to each other perpendicular to the first direction.

20. The computer-readable medium according to claim 16, wherein the instructions are configured to cause the computer system to at least cause sequential performance of a plurality of operational cycles.

* * * * *

UNITED STATES PATENT AND TRADEMARK OFFICE
CERTIFICATE OF CORRECTION

| | |
|---|---|
| PATENT NO. | : 11,249,403 B2 |
| APPLICATION NO. | : 16/636357 |
| DATED | : February 15, 2022 |
| INVENTOR(S) | : Franciscus Maria Joannes Linssen et al. |

It is certified that error appears in the above-identified patent and that said Letters Patent is hereby corrected as shown below:

On the Title Page

Item [56], delete "WO201613901, 09/2016" and insert --WO2016139012, 09/2016-- in the foreign Patent Documents Signed and Sealed this
Seventeenth Day of May, 2022

Katherine Kelly Vidal
*Director of the United States Patent and Trademark Office*